(12) United States Patent
Lee

(10) Patent No.: US 7,880,230 B2
(45) Date of Patent: Feb. 1, 2011

(54) ZERO CAPACITOR RAM WITH RELIABLE DRAIN VOLTAGE APPLICATION AND METHOD FOR MANUFACTURING THE SAME

(75) Inventor: Eun Sung Lee, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 290 days.

(21) Appl. No.: 11/968,701

(22) Filed: Jan. 3, 2008

(65) Prior Publication Data

US 2009/0127621 A1 May 21, 2009

(30) Foreign Application Priority Data

Nov. 16, 2007 (KR) .................... 10-2007-0117207

(51) Int. Cl.
*H01L 27/12* (2006.01)
(52) U.S. Cl. .............. 257/347; 257/296; 257/621; 257/773; 257/774; 257/E21.112
(58) Field of Classification Search ........... 257/347, 257/621, E21.112
See application file for complete search history.

(56) References Cited

U.S. PATENT DOCUMENTS 6,790,721 B2* 9/2004 Hurley .................. 438/201

2004/0159876 A1 8/2004 Fazan et al.
2005/0051815 A1* 3/2005 Snyder .................. 257/288
2008/0237714 A1* 10/2008 Fazan .................... 257/347

FOREIGN PATENT DOCUMENTS

| KR | 1020010065296 A | 7/2001 |
| KR | 1020010071499 A | 7/2001 |
| KR | 1020050047099 A | 5/2005 |

* cited by examiner

*Primary Examiner*—Kenneth A Parker
*Assistant Examiner*—Jose R Diaz
(74) *Attorney, Agent, or Firm*—Ladas & Parry LLP

(57) ABSTRACT

The following discloses and describes a zero capacitor RAM as well as a method for manufacturing the same. The zero capacitor RAM includes an SOI substrate. This SOI substrate is composed of a stacked structure of a silicon substrate, an embedded insulation film and a silicon layer. This layer is patterned into line types to constitute active patterns. Moreover, a first insulation layer forms between the active patterns and gates form on the active patterns as well as the first insulation layer to extend perpendicularly to the active patterns. In addition, a source forms in the active pattern on one side of each gate, a drain forms in the active pattern on the other side of each gate which is achieved by filling a metal layer. Continuing, a contact plug forms between the gates on the source and an interlayer dielectric forms on the contact plug in addition to the gates. Finally, a bit line forms on the interlayer dielectric to extend perpendicularly to the gates and come into contact with the drain.

10 Claims, 12 Drawing Sheets

ZERO CAPACITOR RAM WITH RELIABLE DRAIN VOLTAGE APPLICATION AND METHOD FOR MANUFACTURING THE SAME

CROSS-REFERENCE TO RELATED APPLICATIONS

The present application claims priority to Korean patent application number 10-2007-0117207 filed on Nov. 16, 2007, which is incorporated herein by reference in its entirety.

BACKGROUND OF THE INVENTION

The present invention relates to a semiconductor device, and more particularly, to a zero capacitor random access memory (RAM) which can prevent the reliability thereof from being deteriorated due to the application of a high voltage to drains in addition to a method for manufacturing the same.

As the semiconductor device design has progressed toward high integration, high speed operation, and low power consumption, the focus of the research then has been to achieve stable operational performance in a highly integrated device.

For example, one area of research is directed to a zero capacitor RAM (hereinafter, referred to as a "Z-RAM") in which a plurality of carriers are charged up in a capacitorless floating body so that it is possible to write and read data through changing the threshold voltage (Vt) of a cell.

Since the Z-RAM has no capacitor, the capacitor forming processes are not required in a Z-RAM, and the capacitor forming areas are not needed in a Z-RAM. Therefore, when compared to a typical DRAM, the number of required processes advantageously decreases and the density of the Z-RAM increases.

The Z-RAM is realized using a silicon on insulator (SOI) substrate composed of a silicon substrate, an embedded insulation film, and a silicon layer, rather than a single crystalline silicon substrate made of bulk silicon. The Z-RAM operates as a high potential positive voltage. That is, when a high voltage is applied to drains and hot carriers are produced, pairs of electrons and holes are generated due to impact ionization by the hot carriers. Among the pairs of electrons and holes generated in this way, the electrons exit to the drains by the high voltage applied to the drains, and the remaining holes are stored in the silicon layer serving as the floating body. In a Z-RAM, data can be memorized by the fact that the threshold voltage (Vt) of a transistor varies depending upon the amount of holes stored in the floating body, namely, in the silicon layer.

However, a conventional Z-RAM is susceptible to abnormal operations due to presence of the high potential positive voltage (that is, because the high voltage must be applied to the drains of the ZRAM to generate the holes), thereby deteriorating the reliability of the Z-RAM.

SUMMARY OF THE INVENTION

Embodiments of the present invention are directed to a Z-RAM which can prevent abnormal operation due to the application of a high voltage to drains, and to a method for manufacturing the same.

Also, embodiments of the present invention are directed to a Z-RAM which can operate effectively even when a low voltage is applied to drains, and to a method for manufacturing the same.

Further, embodiments of the present invention are directed to a Z-RAM which ensures stable operation even when a low voltage is applied to drains, thereby improving the reliability thereof, and to a method for manufacturing the same.

In one aspect, a Z-RAM comprises an SOI substrate composed of a stacked structure of a silicon substrate, an embedded insulation film and a silicon layer, with the silicon layer being patterned into line types to constitute active patterns; a first insulation layer formed between the active patterns; a plurality of gates formed on the active patterns and the first insulation layer to extend in a direction perpendicular to the active patterns; a source formed in the active pattern on one side of each gate; a drain formed in the active pattern on the other side of each gate by filling a metal layer; a contact plug formed between the gates on the source; an interlayer dielectric formed on the contact plug and the gates; and a bit line formed on the interlayer dielectric to extend in a direction perpendicular to the gates and come into contact with the drain.

The active pattern has a height of 100~800 Å.

The Z-RAM further comprises a buffer layer interposed between the embedded insulation film of the SOI substrate and the first insulation layer.

The buffer layer comprises a nitride layer.

The Z-RAM further comprises spacers formed on both sidewalls of each gate.

The source comprises an ion implantation layer which is formed by ion-implanting N-type impurities.

The metal layer for the drain includes a barrier metal layer.

The metal layer for the drain comprises a W layer, and the barrier metal layer comprises a ternary layer of Ti/TiN/WN.

The Z-RAM further comprises doped silicon epitaxial layers formed as ohmic contact layers between the drain and the active patterns.

The Z-RAM further comprises a second insulation layer formed in regions between the gates, excluding regions in which the contact plug and the bit line are formed.

The contact plug comprises a polysilicon layer.

The bit line comprises a metal layer.

The metal layer for the bit line includes a barrier metal layer.

The metal layer for the bit line comprises a W layer, and the barrier metal layer comprises a ternary layer of Ti/TiN/WN.

The bit line includes a hard mask.

In another aspect, a method for manufacturing a Z-RAM comprises the steps of preparing an SOI substrate composed of a stacked structure of a silicon substrate, an embedded insulation film and a silicon layer; and forming line type active patterns by patterning the silicon layer; forming a buffer layer on the active patterns and the embedded insulation film; forming a first insulation layer on the buffer layer between the active patterns; removing a portion of the buffer layer and a portion of the active pattern which are positioned in each drain forming region of each active pattern; forming a metal layer to fill the removed portion of the active pattern; removing the metal layer, the buffer layer and the first insulation layer to expose the active pattern, and thereby forming a drain made of the metal layer; forming a plurality of gates on the active pattern including the drain and on the first insulation layer to extend in a direction perpendicular to the active pattern; forming a second insulation layer to fill spaces between the gates; removing a portion of the second insulation layer which is positioned in each source forming region of each active pattern; forming a source in a portion of the active pattern which is positioned in the source forming region and is exposed due to removal of the second insulation layer; forming a contact plug on the source; forming an interlayer dielectric on the contact plug and the gates; and forming a bit line on the interlayer dielectric to come into contact with the drain and extend in a direction perpendicular to the gates.

The active patterns are formed to have a height of 100~800 Å.

The buffer layer comprises a nitride layer.

The step of removing a portion of the buffer layer as well as a portion of the active pattern which are positioned in each drain forming region of each active pattern, comprises the steps of forming a drain open mask on the first insulation layer and the buffer layer to expose each drain forming region of each active pattern; etching sequentially a portion of the buffer layer and a portion of the active pattern which are positioned in the drain forming region using the drain open mask as an etch mask; and removing the drain open mask.

The drain open mask comprises a photoresist layer.

After the step of removing the portion of the active pattern which is positioned in the drain forming region, and before the step of forming a metal layer, the method further comprises the step of forming doped silicon epitaxial layers on sidewalls of the active pattern which are exposed due to removal of the portion of the active pattern which is positioned in the drain forming region.

The metal layer for the drain includes a barrier metal layer.

The metal layer for the drain comprises a W layer, and the barrier metal layer comprises a ternary layer of Ti/TiN/WN.

After the step of forming a plurality of gates and before the step of forming a second insulation layer, the method further comprises the step of forming spacers on both sidewalls of each gate.

The step of removing a portion of the second insulation layer, which is positioned in each source forming region of each active region, comprises the steps of forming a source open mask on the gates and the second insulation layer to expose a portion of the second insulation layer which is positioned in each source forming region of each active region; etching the exposed portion of the second insulation layer using the source open mask as an etch mask; and removing the source open mask.

The source open mask comprises a photoresist layer.

The source comprises an ion implantation layer which is formed by ion-implanting N-type impurities.

The contact plug comprises a polysilicon layer.

The bit line comprises a metal layer.

The metal layer for the bit line includes a barrier metal layer.

The metal layer for the bit line comprises a W layer, and the barrier metal layer comprises a ternary layer of Ti/TiN/WN.

The bit line is formed to have a hard mask thereon.

DESCRIPTION OF SPECIFIC EMBODIMENTS

In the present invention, voltage drop in the drains can be minimized since drains are made of a metal layer, and accordingly, the hole generation efficiency is maximized to allow a Z-RAM to effectively operate even at a low drain voltage.

Therefore, in the present invention, it is possible to prevent abnormal operation which would normally result with the application of a high voltage to drains. As such, reliability of the Z-RAM is improved as stable driving is ensured at a low drain voltage.

Hereafter, specific embodiments of the present invention will be described in detail with reference to the attached drawings.

Figure 1:
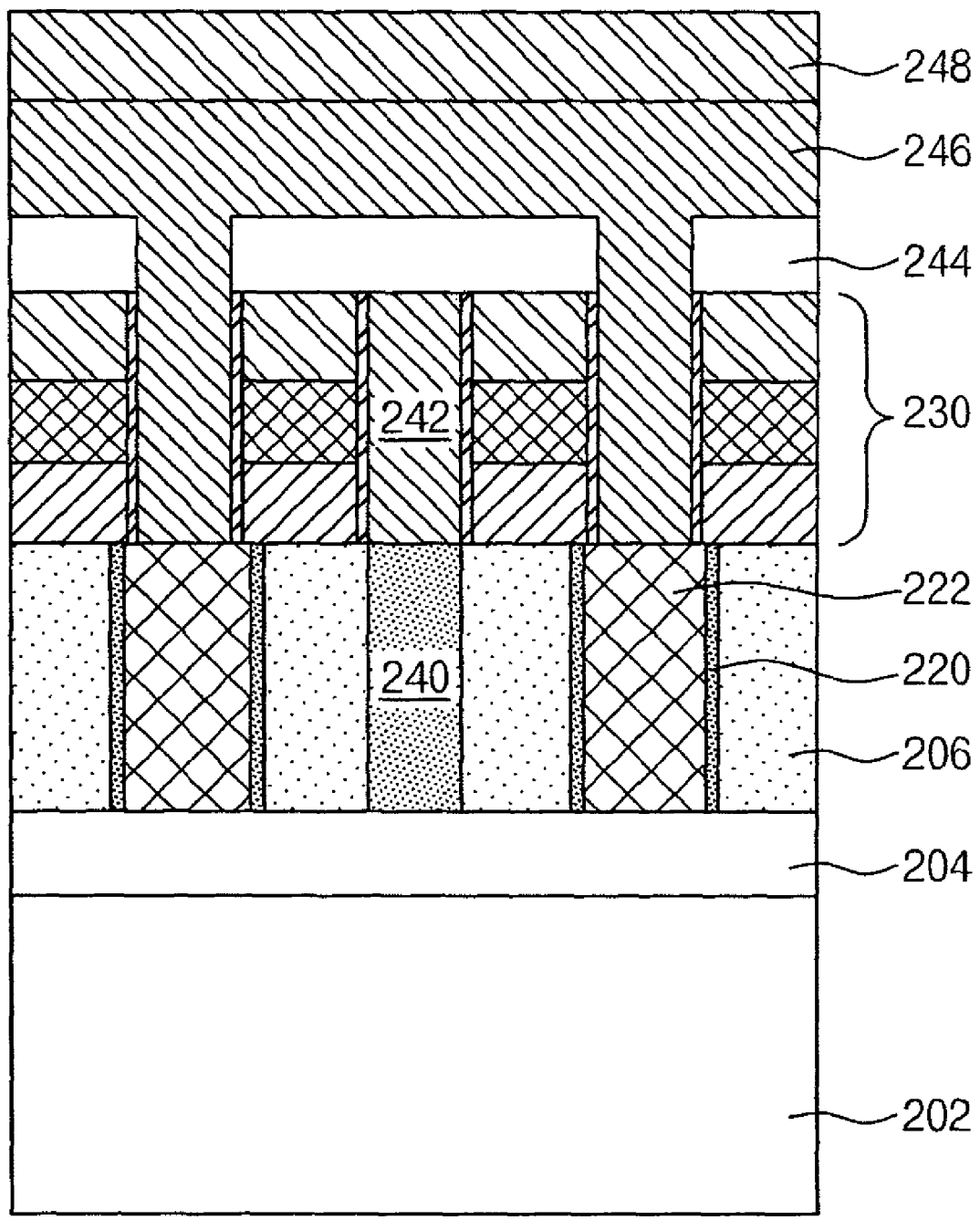
FIG. 1 is a cross-sectional view illustrating a zero capacitor RAM ("the Z-RAM") in accordance with an embodiment of the present invention.

FIG. 1 is a cross-sectional view illustrating a Z-RAM in accordance with an embodiment of the present invention.

Referring to FIG. 1, a Z-RAM is realized on a silicon on insulator (SOI) substrate, which comprises a stacked structure of a silicon substrate 202, an embedded insulation film 204, and a silicon layer that is patterned into line type active patterns 206. A gate 230 is formed on each of the active patterns 206. A source 240 is formed in the active pattern 206 on one side of each gate 230, and a drain 222 is formed between the active patterns 206 on the other side of each gate 230. The source 240 is formed as an ion implantation layer into which N-type impurities are ion-implanted. The drain 222 is formed by filling a metal layer in a contact hole. Doped silicon epitaxial layers 220, as ohmic contact layers, are formed between the active patterns 206 and the drain 222 formed by filling a metal layer in a contact hole.

A contact plug 242 is formed on the source 240 between two adjoining gates 230. An interlayer dielectric 244 is formed on the gates 230 and contact plugs 242 Bit lines 246 are formed on the interlayer dielectric 244 such that the bit lines 246 are oriented to extend in a direction perpendicular to the gates 230 and are brought into contact with drains 222. The bit lines 246 have a hard mask 248 formed thereon.

Therefore, the voltage drop in the drain 222 is minimized in the Z-RAM according to the present invention, since the drain 222 has the shape of a cylindrical metal contact plug which is formed by filling a metal layer into a contact hole when compared to the conventional drain which is formed as an N+ ion implantation layer by ion-implanting N-type impurities.

Accordingly, a Z-RAM can effectively operate even at a low drain voltage in the present invention, due to the fact that hole generation efficiency can be maximized by forming a drain using a metallic material. Therefore, it is possible to prevent the reliability of the Z-RAM from being deteriorated due to the application of a high voltage to a drain as in the conventional art.

Hereafter, a method for manufacturing a Z-RAM in accordance with an embodiment of the present invention will be described with reference to FIGS. 2A through 2I and 3A through 3I. FIGS. 2A through 2I are plan views illustrating the processes of the method, and FIGS. 3A through 3I are cross-sectional views taken along the lines III-III' of FIGS. 2A through 2I, illustrating the processes of the method.

Figure 2A:
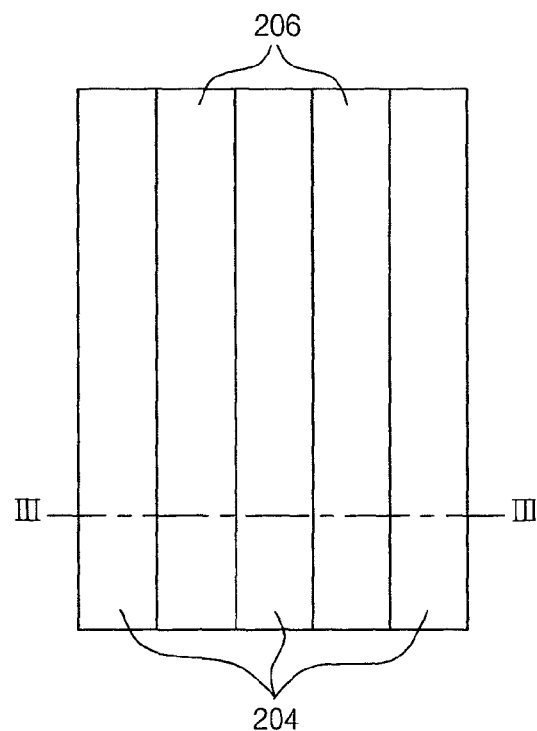
FIGS. 2A through 2I are plan views illustrating the processes of a method for manufacturing a Z-RAM in accordance with another embodiment of the present invention.
Figure 3A:
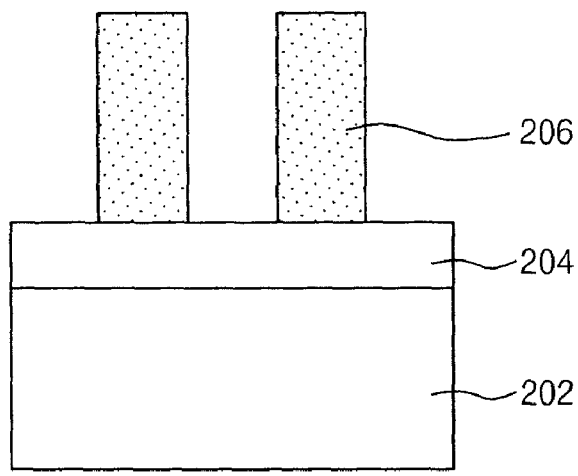
FIG. 3A through 3I are cross-sectional views taken along the lines III-III' of FIGS. 2A through 2I.

Referring to FIGS. 2A and 3A, after preparing an SOI substrate comprising a stacked structure of a silicon substrate 202, an embedded insulation film 204, and a silicon layer, predetermined portions of the silicon layer are etched to form a plurality of line type active patterns 206. The thickness of the silicon layer, that is, the height of the active patterns 206, is in the range of 100~800 Å.

Figure 2B:
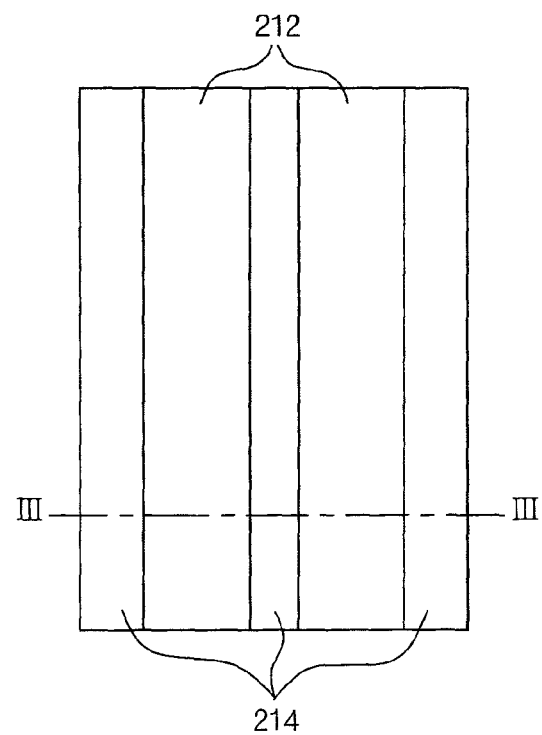
Figure 3B:
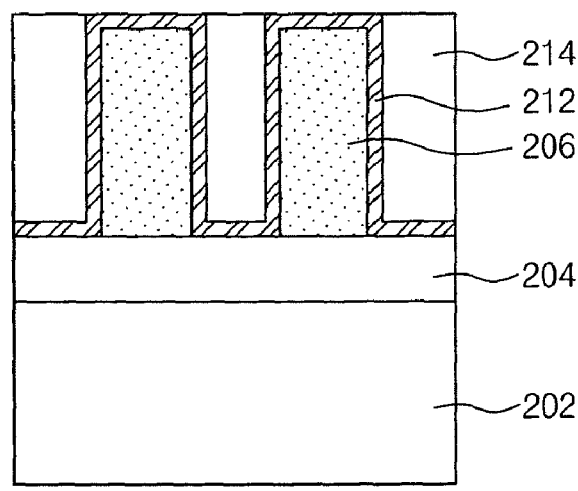

Referring to FIGS. 2B and 3B, a buffer layer 212 for reducing stress is formed on the active patterns 206 and the embedded insulation film 204. For example, a nitride layer is used as the material for the buffer layer 212 for reducing a stress. Then, a first insulation layer 214 is deposited on the buffer layer 212 to a thickness completely filling the spaces between the active patterns 206, and then the first insulation layer 214 is chemically and mechanically polished (hereinafter also referred to as "CMPed") such that the buffer layer 212 on the top surface of each active pattern 206 is exposed.

Figure 2C:
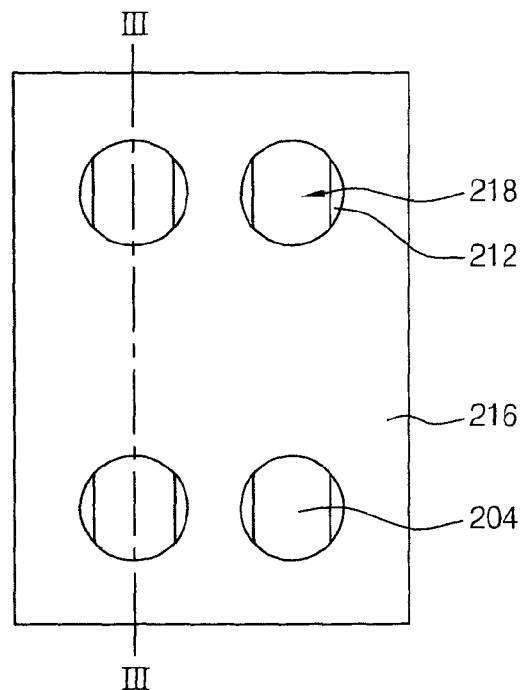
Figure 3C:
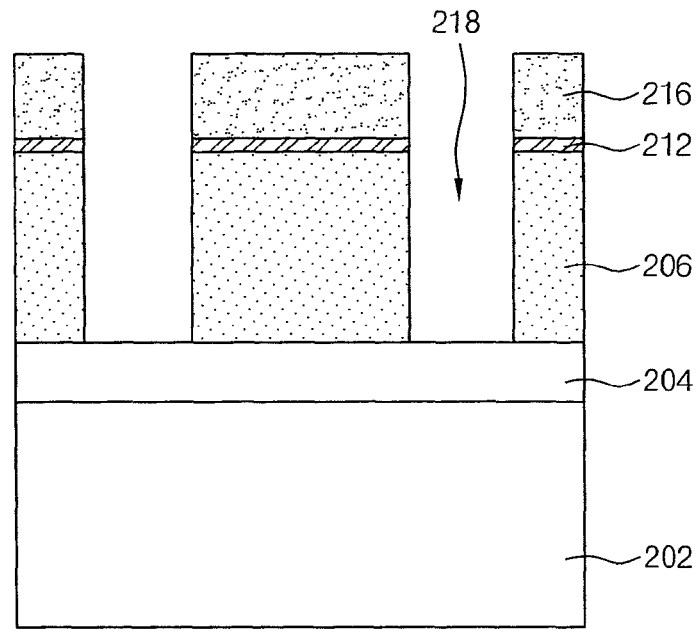

Referring to FIGS. 2C and 3C, a drain open mask 216 is formed on the CMPed first insulation layer 214 and the buffer layer 212 to expose the drain forming regions on each active pattern 206. Preferably, the drain open mask 216 is formed of a photoresist layer. A first contact hole 218 is defined to expose the embedded insulation film 204 by etching a portion of the buffer layer 212 which is exposed in each drain forming region and a portion of the active pattern 206 which is placed under the exposed portion of the buffer layer 212 in each drain forming region, using the drain open mask 216 as an etch mask.

Figure 2D:
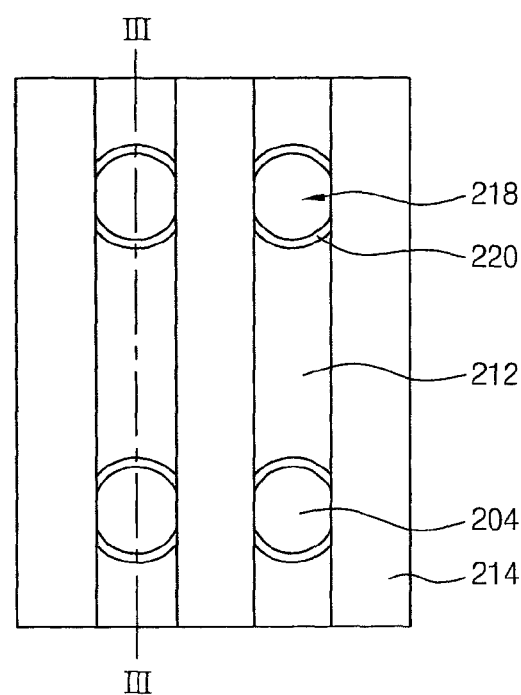
Figure 3D:
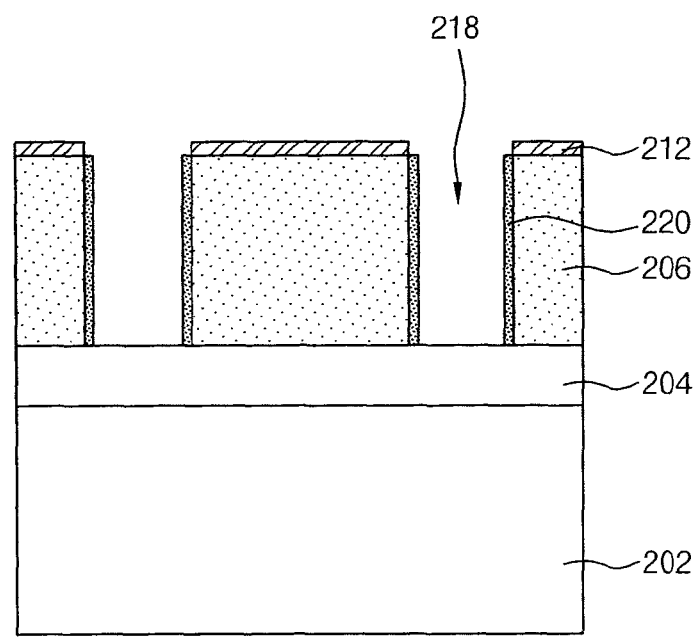

Referring to FIGS. 2D and 3D, the drain open mask 216 is removed. Doped silicon epitaxial layers 220 are formed as ohmic contact layers through selective epitaxial growth on the sidewalls of each first contact hole 218, that is, the sidewalls of the active pattern 206 which are formed by etching the portion of the active pattern 206 which is placed under the exposed portion of the buffer layer 212 in each drain forming region. The silicon epitaxial layers 220 are formed to be doped with N-type impurities.

Figure 2E:
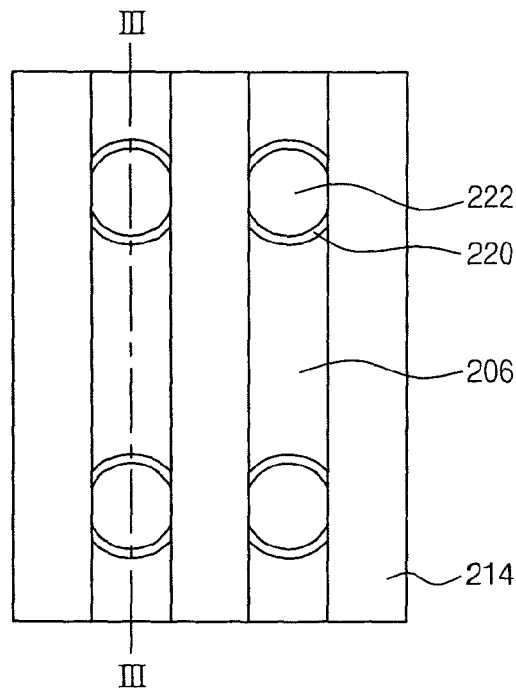
Figure 3E:
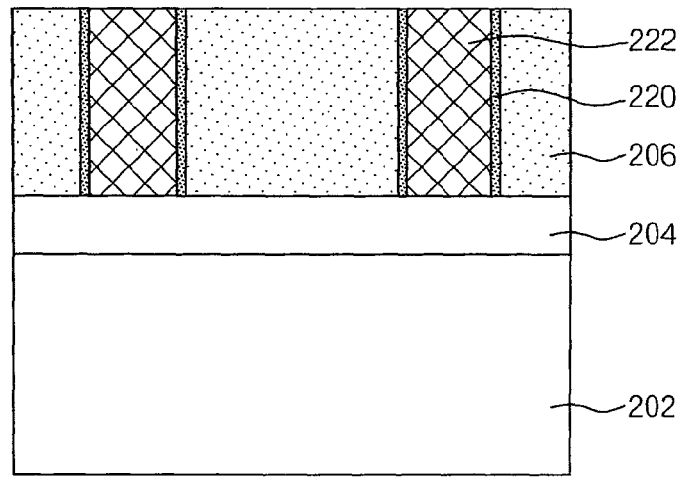

Referring to FIGS. 2E and 3E, after depositing a metal layer on the embedded insulation film 204 including the doped silicon epitaxial layers 220, the buffer layer 212 (see FIG. 3D), and the first insulation layer 214 (see FIG. 2E) to a thickness completely filling the first contact hole 218, the metal layer, the buffer layer 212, and the first insulation layer 214 are removed through a chemical and mechanical polishing process (hereinafter also referred to as "the CMPing" process) to expose the active pattern 206, a drain 222 is formed to have a cylindrical shape. That is, the drain 222 is formed by filling the metal layer in the drain forming region, in which the portion of the active pattern 206 is removed. The metal layer for the drain 222 includes a barrier metal layer. Preferably, W is used as the material for the metal layer for the drain 222, and the ternary layer of Ti/TiN/WN is used as the material for the barrier metal layer.

Here, the voltage drop in a drain made according to an embodiment of the present invention is significantly decreased, because the drain is formed of a metal layer as opposed to an N+ ion implantation layer in a conventional drain. This would maximize the hole generation efficiency such that a Z-RAM can effectively operate even at a low drain voltage. Consequently, the present invention makes it possible to prevent the reliability of a Z-RAM from being deteriorated due to the application of a high voltage to a drain as in the conventional art.

Figure 2F:
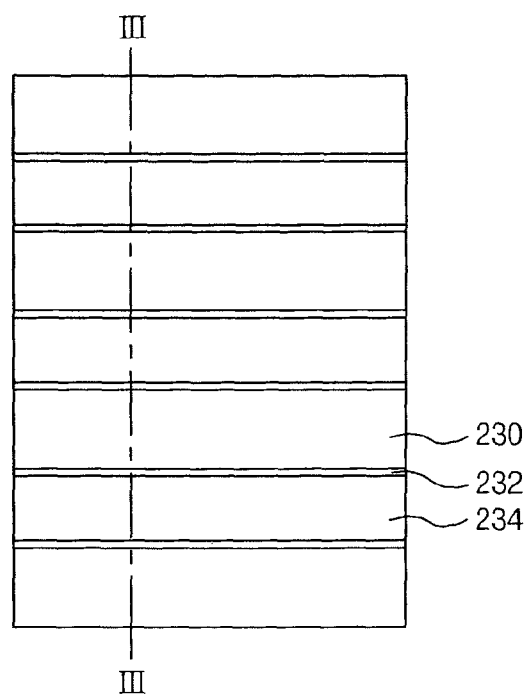
Figure 3F:
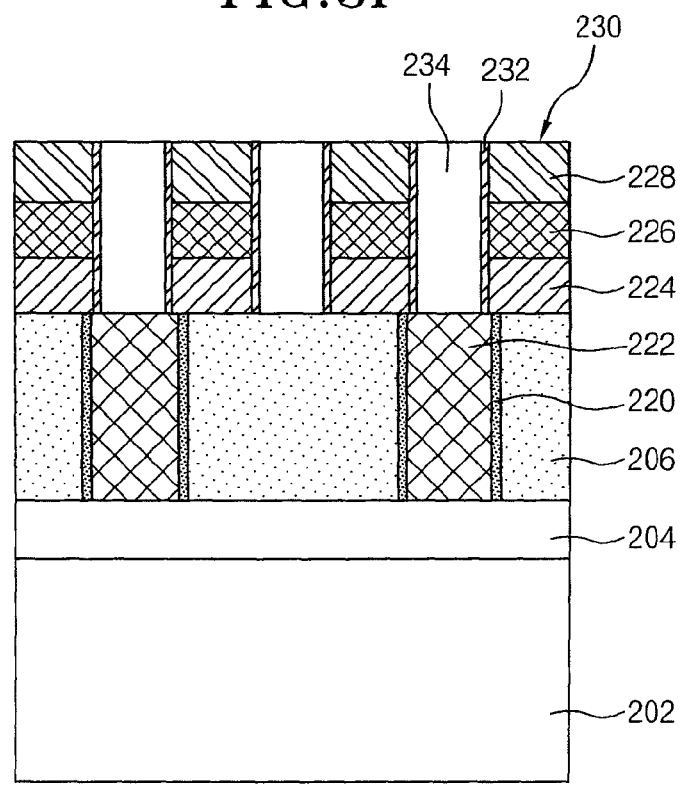

Referring to FIGS. 2F and 3F, a gate insulation layer (not shown), a first gate conductive layer 224 made of a polysilicon layer, a second gate conductive layer 226 made of a metal-based layer, and a hard mask layer 228 made of a nitride layer are sequentially deposited on the active pattern 206 including the doped silicon epitaxial layers 220 and the drains 222 and the first insulation layer 214. Then, the deposited layers 228, 226, and 224 are etched to form a plurality of gates 230 on the active patterns 206 and the first insulation layer 214 such that the gates 230 are located to extend in a direction perpendicular to the active patterns 206. Spacers 232 are formed on both sidewalls of each gate 230 by a well-known process. After depositing a second insulation layer 234 to a thickness capable of completely filling the spaces between the gates 230 including the spacers 232, the second insulation layer 234 is CMPed to expose the gates 230.

Figure 2G:
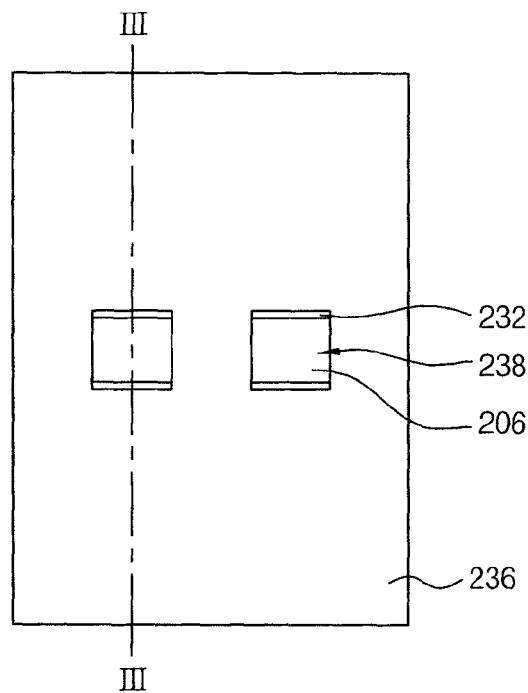
Figure 3G:
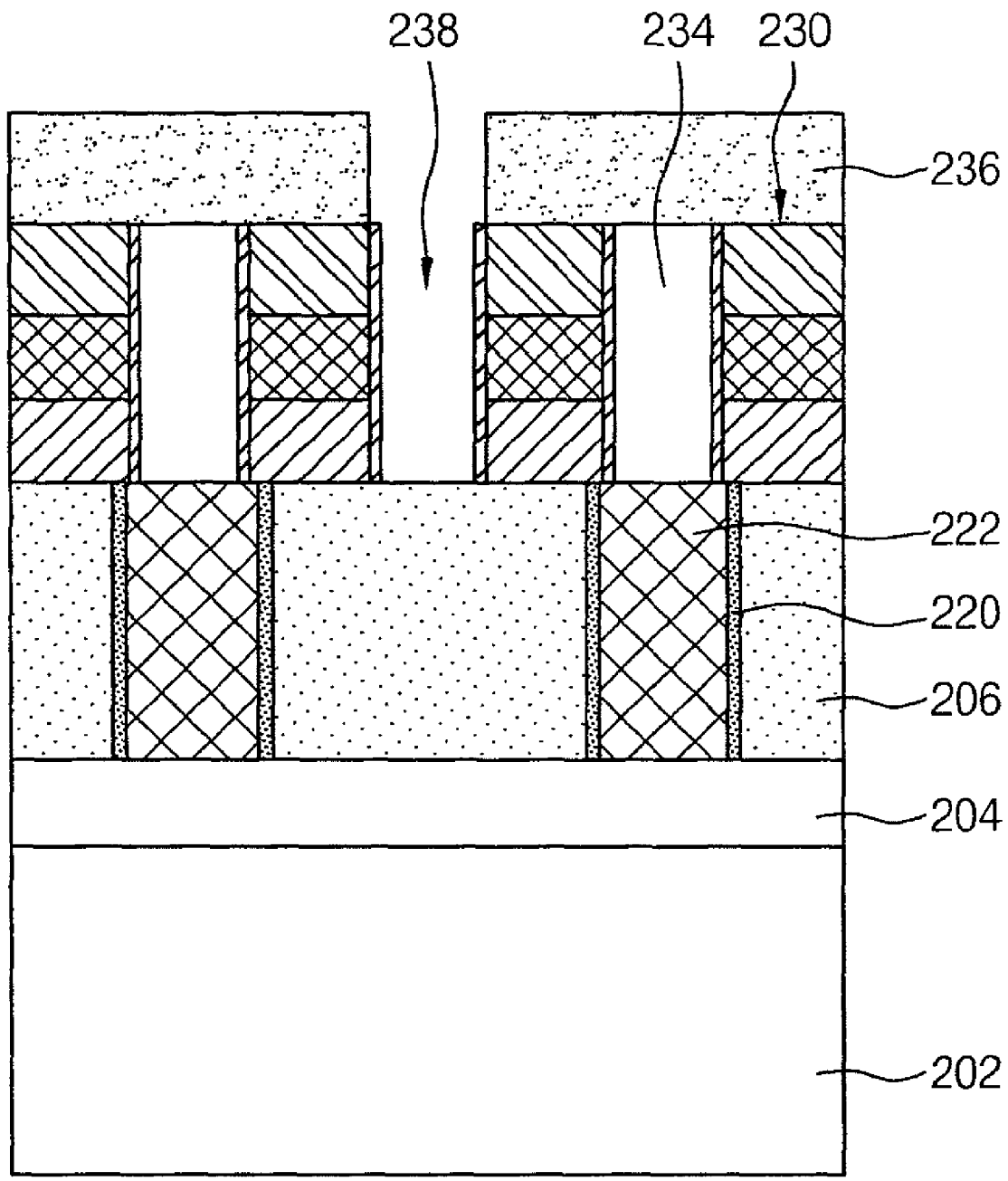

Referring to FIGS. 2G and 3G, a source open mask 236 is formed on the second insulation layer 234 and the gates 230 to expose a portion of the second insulation layer 234 which is in the source forming region on the active pattern 206. Preferably, the source open mask 236 is formed of a photoresist layer. By etching the exposed portion of the second insulation layer 234 using the source open mask 236 as an etch mask, a second contact hole 238 is defined to expose a portion of the active pattern 206 in the source forming region.

Figure 2H:
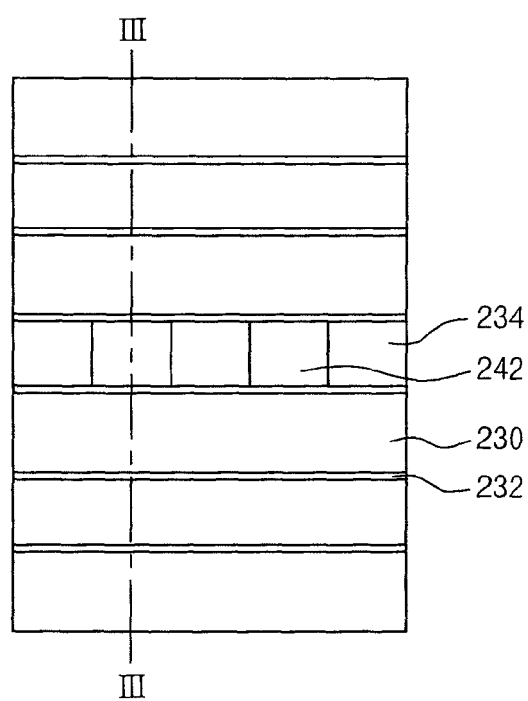
Figure 3H:
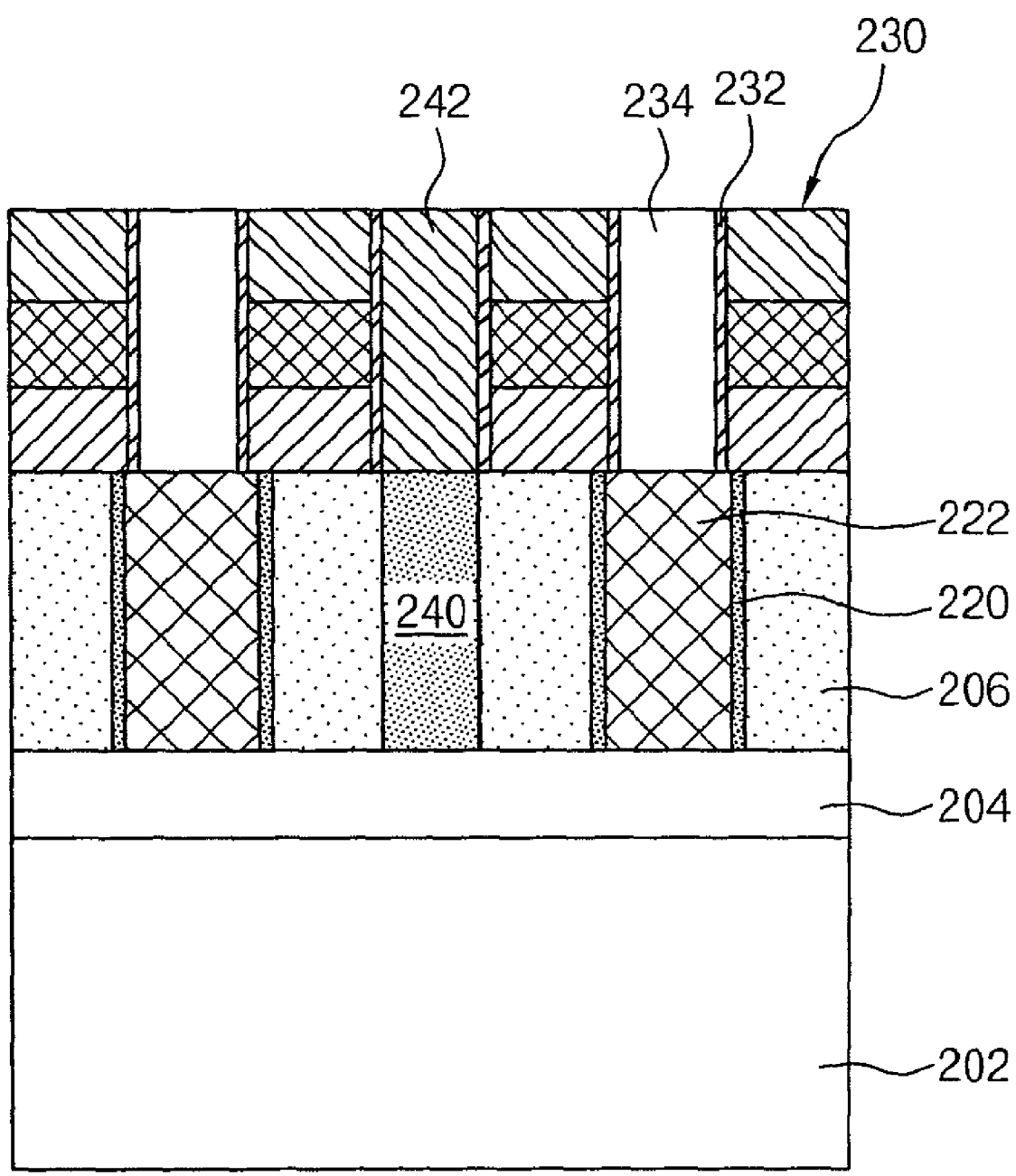

Referring to FIGS. 2H and 3H, the source open mask 236 is removed. a source 240 made of an N+ ion-implantation layer is formed by ion-implanting predetermined conductivity type impurities, for example, N-type impurities into the portion of the active pattern 206 in the source forming region which is exposed through the second contact hole 238. A contact plug 242 is formed in the second contact hole 238 to come into contact with the source 240 after depositing a conductive layer, (preferably, a polysilicon layer) on the gates 230 including the spacers 232 and the second insulation layer 234 to a thickness capable of completely filling the second contact hole 238, and by CMPing the polysilicon layer to expose the gates 230.

Figure 2I:
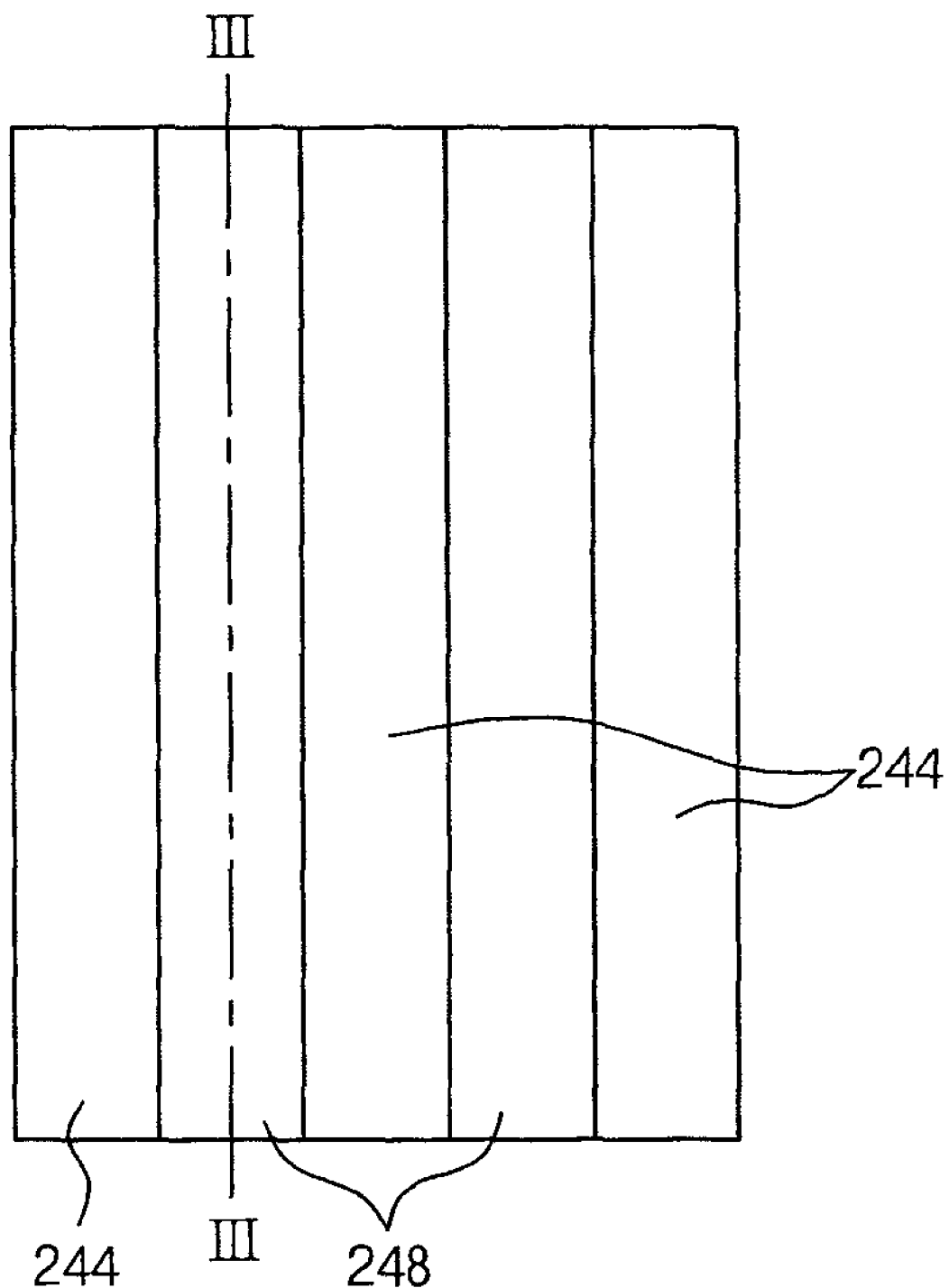
Figure 3I:
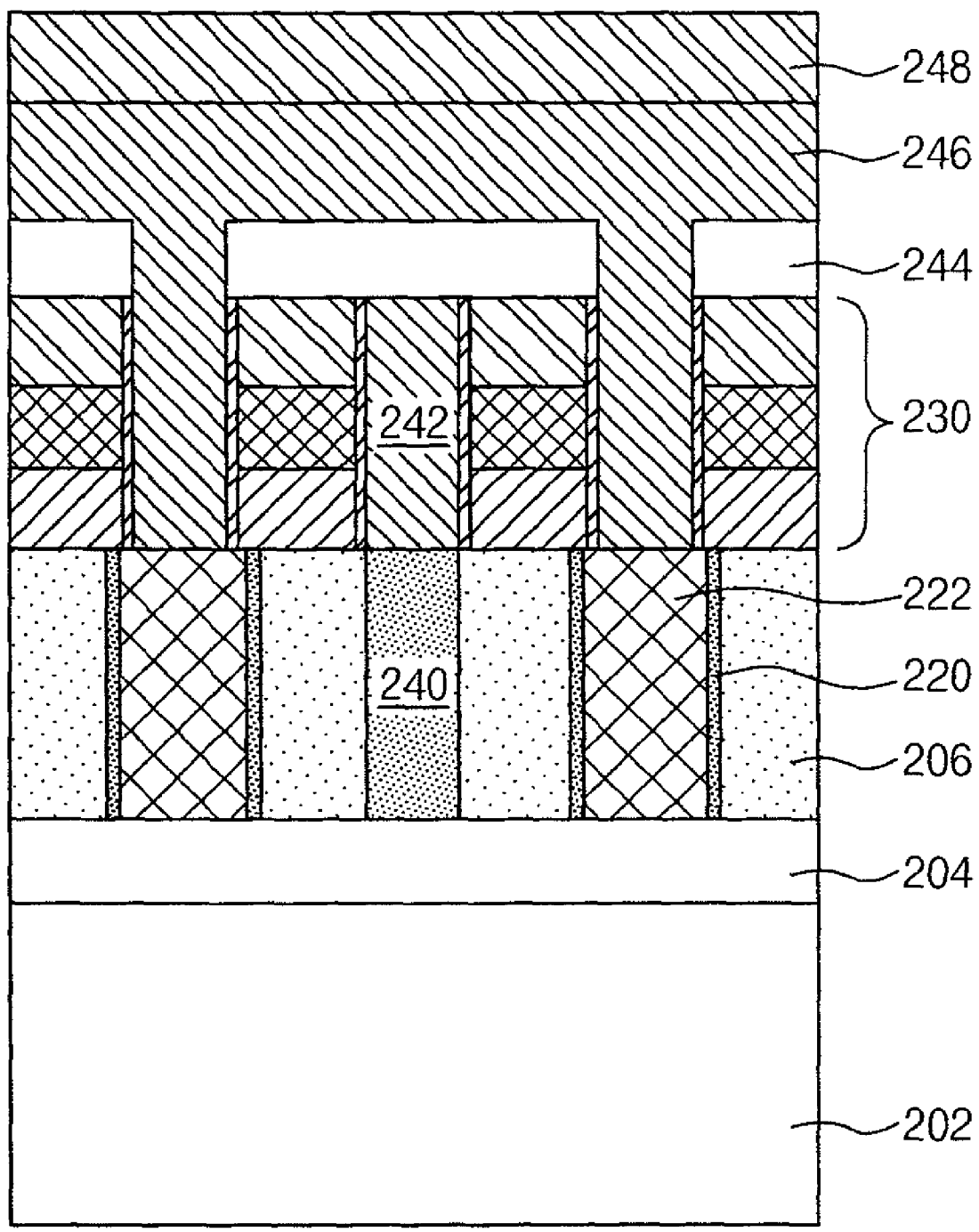

Referring to FIGS. 2I and 3I, an interlayer dielectric 244 is formed on the gates 230 including the contact plug 242 and the spacers 232 and the second insulation layer 234. By etching the interlayer dielectric 244 and the second insulation layer 234, the drains 222 made of the metal layer are exposed. A metal layer for bit lines is formed on the interlayer dielectric 244 to come into contact with the exposed drains 222. The metal layer for bit lines includes a barrier metal layer. Preferably, W is used as the material for the metal layer for bit lines, and the ternary layer of Ti/TiN/WN is used as the material for the barrier metal layer. After depositing a hard mask layer on the metal layer for bit lines, by patterning the hard mask layer into the shapes of bit lines, a hard mask 248 for bit lines is formed. In succession, by etching the metal layer for bit lines including the barrier metal layer, using the hard mask 248 for bit lines as an etch mask, bit lines 246 are formed on the interlayer dielectric 244 to come into contact with the drains 222 and extend in a direction perpendicular to the gates 230.

Thereafter, while not shown in the drawings, by sequentially implementing a series of well-known subsequent processes, the manufacture of the Z-RAM according to the embodiments of the present invention is completed.

As is apparent from the above description, the present invention provides advantages. Since drains are made of a metal layer, even though a low voltage is applied to the drains, a Z-RAM can effectively operate. Accordingly, the present invention prevents the reliability of the Z-RAM from being deteriorated due to the application of a high voltage to the drains. As a consequence, the operation characteristics and the reliability of the Z-RAM is improved.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A zero capacitor RAM comprising:
    an SOI substrate comprising a stacked structure of a silicon substrate, an embedded insulation film, and a silicon layer, wherein the silicon layer is patterned into line types to constitute active patterns;
    a first insulation layer formed between the active patterns;
    a plurality of gates formed on the active patterns and the first insulation layer to extend in a direction perpendicular to the active patterns;
    a source formed in the active pattern on one side of each gate;

a drain formed in the active pattern on the other side of each gate by filling a metal layer;
doped silicon epitaxial layers formed as ohmic contact layers between the drain and the active patterns;
a contact plug formed between the gates on the source;
an interlayer dielectric formed on the contact plug and the gates; and
a bit line formed on the interlayer dielectric to extend in a direction perpendicular to the gates and come into contact with the drain.

2. The zero capacitor RAM according to claim 1, wherein the active pattern has a height in the range of 100~800 Å.

3. The zero capacitor RAM according to claim 1, further comprising:
a buffer layer interposed between the embedded insulation film of the SOI substrate and the first insulation layer and comprising a nitride layer.

4. The zero capacitor RAM according to claim 1, further comprising:
spacers formed on both sidewalls of each gate.

5. The zero capacitor RAM according to claim 1, wherein the source comprises an ion implantation layer.

6. The zero capacitor RAM according to claim 1, wherein the metal layer for the drain includes a barrier metal layer.

7. The zero capacitor RAM according to claim 6, wherein the metal layer for the drain comprises a W layer, and the barrier metal layer comprises a ternary layer of Ti/TiN/WN.

8. The zero capacitor RAM according to claim 1, further comprising:
a second insulation layer formed in regions between the gates, excluding regions in which the contact plug and the bit line are formed.

9. The zero capacitor RAM according to claim 1, wherein the bit line comprises a metal layer including a barrier metal layer.

10. The zero capacitor RAM according to claim 9, wherein the metal layer for the bit line comprises a W layer, and the barrier metal layer comprises a ternary layer of Ti/TiN/WN.

* * * * *